United States Patent
Scheer et al.

(10) Patent No.: US 7,632,631 B2
(45) Date of Patent: Dec. 15, 2009

(54) METHOD OF PREVENTING PINHOLE DEFECTS THROUGH CO-POLYMERIZATION

(75) Inventors: Steven A. Scheer, Poughkeepsie, NY (US); Colin J. Brodsky, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 611 days.

(21) Appl. No.: 11/029,813

(22) Filed: Jan. 5, 2005

(65) Prior Publication Data

US 2006/0147849 A1 Jul. 6, 2006

(51) Int. Cl.
*G03F 7/00* (2006.01)
(52) U.S. Cl. ............ 430/330; 430/270.1; 430/271.1; 430/273.1; 430/276.1; 430/935
(58) Field of Classification Search ............ 430/271.1, 430/273.1, 276.1, 270.1, 330, 935; 428/212
See application file for complete search history.

(56) References Cited

U.S. PATENT DOCUMENTS

| | | | | |
|---|---|---|---|---|
| 2002/0193495 | A1* | 12/2002 | Palamone et al. | 524/458 |
| 2003/0082477 | A1* | 5/2003 | Szmanda et al. | 430/270.1 |
| 2006/0003153 | A1* | 1/2006 | Brodsky et al. | 428/213 |

OTHER PUBLICATIONS

U.S. Appl. No. 10/880,818, "Film Stack Having Under Layer for Preventing Pinhole Defects", filed Jun. 30, 2004.

D. E. Seeger et al., "Thin-film Imaging: Past, Present, Prognosis," *IBM Jnl. Res. Develop.* (*Optical Lithography*) vol. 41, No. 1/2, p. 105 (1997).

D. Taylor et al., "Measuring and Accessing Printability of Reticle Pinhole Defects," *Proc. SPIE* (18th Europ. Conf. On Mask Technology for Integrated Circuits and Microcomponents, vol. 4764, pp. 202-209 (2002) (Abstract Only).

G. Reiter et al., "Thin Film Instability Induced By Long Range Forces," *Langmuir*, vol. 15, pp. 2551-2558 (1999).

R. Seemann et al., "Dewetting Patterns and Molecular Forces: A Reconciliation," *Physical Review Letters*, vol. 86, No. 24, pp. 5534-5537 (2001).

S. Nir, "Van Der Waals Interactions Between Surfaces of Biological Interest," *Progress In Surface Science*, vol. 8, No. 1, pp. 1-58 (1976).

(Continued)

*Primary Examiner*—Thorl Chea
(74) *Attorney, Agent, or Firm*—Steven Capella

(57) ABSTRACT

A method is provided for forming a stable thin film on a substrate. The method includes depositing a co-polymer composition having a first component and a second component onto a substrate to form a stable film having a first thickness. The first component has first dielectric properties not enabling the first component by itself to produce the stable film having the first thickness. However, the second component has second dielectric properties which impart stability to the film at the first thickness. In a preferred embodiment, the second component includes a leaving group, and the method further includes first thermal processing the film to cause a solvent but not the leaving group to be removed from the film, after which second thermal processing is performed to at least substantially remove the leaving group from the film. As a result, the film is reduced to a second thickness smaller than the first thickness, and the film remains stable during both the first and the second thermal processing.

13 Claims, 5 Drawing Sheets

OTHER PUBLICATIONS

J. N. Israelachvili, *Intermolecular and Surface Forces* (London Academic Press), pp. 176-209.

Li et al, Inhibition of thin polystyrene film dewetting via phase separation, Polymer 44 (2003), p. 5833-5841, Available online Jul. 18, 2003.

D.E. Seeger, et al., "Thin-film Imaging: Past, Present, Prognosis", IBM Jnl. Res. Develop. (Optical Lithography) vol. 41 No. 1/2 p. 105 (1997).

D. Taylor et al., "Measuring and Accessing Printability of Reticle Pinhole Defects," Proc. SPIE (18th Europ. Conf. On Mask Technology for Integrated Circuits and Microcomponents, vol. 4764, pp. 202-209 (2002) (Abstract Only).

G. Reiter, et al., "Thin Film Instability Induced By Long Range Forces," Langmuir, vol. 15 pp. 2551-2558 (1999).

R. Seemann,, et al. "Dewetting Patterns and Molecular Forces: A Reconciliation," Physical Review Letters vol. 86, No. 24, pp. 5534-5537 (2001).

S. Nir, "Van Der Waals Interactions Between Surfaces of Biological Interest," Progress In Surface Science, vol. 8 No. 1, pp. 1-58 (1976).

\* cited by examiner

METHOD OF PREVENTING PINHOLE DEFECTS THROUGH CO-POLYMERIZATION

BACKGROUND OF THE INVENTION

The present invention relates to the processing of thin films, such as those used in the processing of very small structures including microelectronic devices.

The industry goal of reducing the size of microelectronic devices places greater demands on photolithography as a technology. As more aggressive solutions are pursued to meet such increased demands, thinner polymer films have to be used as anti-reflective coatings (ARCs) and in photoresist imaging films. The use of thin polymer films, unfortunately, most often leads to device defects, such as those that occur due to long range van der Waals forces. Due to van der Waals forces, localized thinning of a polymer film on a substrate occurs when the polymer film has insufficient thickness to overcome a tendency to dewet from the substrate. This leads to dewetting defects, also known as "pinhole" defects. An example of this phenomenon is illustrated in FIG. 1 for a bottom anti-reflective coating (BARC) film disposed on a substrate of silicon dioxide.

FIG. 1 illustrates a free energy curve 10 for a BARC film disposed on a substrate of silicon dioxide, and a second curve 12 being the second derivative of the free energy curve 10. The BARC film becomes unstable and has a tendency to dewet catastrophically at a thickness (50 nm) below which the free energy curve 10 turns sharply lower and heads negative. Such catastrophic dewetting is referred to as spinodally dewetting. The location of the zero in the second curve 12 illustrating the second derivative of free energy indicates a crossover point at about 85 nm between a film that dewets spinodally below that thickness and dewets via nucleation and growth of holes above that thickness.

By examining the curves presented in FIG. 1, one can readily determine that a BARC film having a thickness of 80 nm, which is less than the crossover point thickness of 85 nm, is highly unstable, and dewets spinodally, rapidly dewetting to droplets. On the other hand, a BARC film having a nominal thickness of 110 nm, does not dewet spinodally, but can still dewet locally via nucleation and growth of holes, particularly since the thickness of the film actually varies randomly from point to point in the film. When the thickness of the film is increased, however, the occurrence of defects becomes less likely. For example, a BARC film having a thickness of 200 nm is so far from the crossover point on the free energy diagram that random local fluctuations in film thickness no longer result in local instability of the film.

Heretofore, there has been no known solution to this problem other than to increase the thickness of the film, the very concept of which is contrary to the industry goal of reducing device size. In addition, advanced lithography processes call for reduction rather than increases in film thicknesses, especially since a thick BARC film unnecessarily increases the difficulty of etching through the BARC film. Similarly, a thick photoresist imaging film also increases risk of line pattern collapse and reduces the process window, making it more difficult to correctly expose and develop.

Currently, it is common to utilize surface treatments such as hexamethyldisilazane (HMDS) prime, prior to applying a coating such as an ARC or a photoresist. Such treatment promotes adhesion by changing the surface tension, and can also affect wettability of the coating by changing the spreading coefficient. However, even when a coating has a positive spreading coefficient, pinholes can still form when instability is present due to long range van der Waals forces. Therefore, pre-treating a surface with a surface treatment such as an HMDS prime, while affecting the size and shape of dewetting defects, does not prevent them from appearing in the first instance.

Accordingly, it would be desirable to provide a method by which the thickness of a film utilized in semiconductor fabrication can be reduced while precluding defects in the film caused by long range van der Waals forces.

SUMMARY OF THE INVENTION

According to one aspect of the invention, a method is provided for forming a stable thin film on a substrate. The method includes depositing a co-polymer composition having a first component and a second component onto a substrate to form a stable film having a first thickness. The first component has first dielectric properties not enabling the first component by itself to produce the stable film having the first thickness. However, the second component has second dielectric properties which impart stability to the film at the first thickness. In a preferred embodiment, the second component includes a leaving group, and the method further includes first thermal processing the film to cause a solvent but not the leaving group to be removed from the film, after which second thermal processing is performed to at least substantially remove the leaving group from the film. As a result, the film is reduced to a second thickness smaller than the first thickness, and the film remains stable during both the first and the second thermal processing.

DETAILED DESCRIPTION

Accordingly, methods are provided for forming a stable thin co-polymer film on a substrate, the film including a component having dielectric properties which impart stability to the film at the deposited thickness. This component stabilizes the film by modifying its dielectric properties from that which would otherwise result in an unstable film at the deposited thickness due to the inclusion of a base component of the film.

Figure 2:
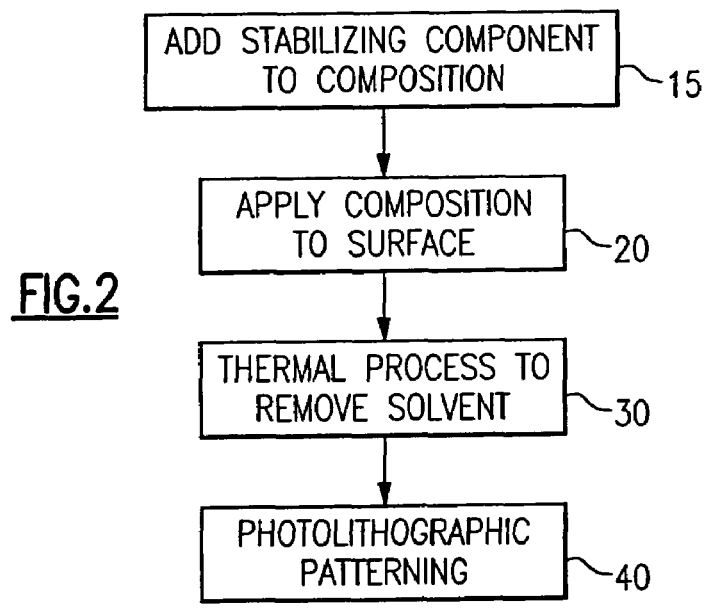
FIG. 2 is a flowchart illustrating a processing method in accordance with one embodiment of the invention.

Accordingly, FIG. 2 illustrates a process flow in accordance with a first embodiment of the invention. As shown therein, in an initial step (15), a co-polymer composition is provided by adding a stabilizing component to a base component of the composition. As described more fully below, the stabilizing component has dielectric properties which impart stability to the deposited film, i.e., by reducing or eliminating the long range attractive force between the substrate and the medium such as air which overlies the film. As used herein, the terms "stable" and "stability" refer to a condition in which a film having a given thickness is not subject to dewetting from a substrate, either by spinodal dewetting or by nucleation and growth of holes. In a particular embodiment, the film includes a photoresist. In another embodiment, the film includes an anti-reflective coating (ARC). However, the processes and structures achieved by the present invention are not limited to photoresists and ARCs. For example, improved spin-on dielectric films are provided in accordance with the invention.

With the addition of the stabilizing component, at step (20) the co-polymer composition is deposited to form a stable film having a desirably small thickness. Specifically, a stable film is achieved which has a smaller thickness than the thickness of a film which can be achieved by depositing a composition which contains only a base component of the film.

Thereafter, as shown at step (30), the film is thermally processed to remove a solvent therein. For example, the film is baked in what is commonly called a "post-apply-bake". Most polymeric compositions used to deposit films include a solvent to promote spreading and self-planarization of the composition. Thermal processing helps to stabilize the film, and decrease the mobility of the polymeric material within the film.

After the thermal processing, the film is in a condition ready for additional processing. In a particular embodiment in which the film is a photoresist film or ARC, the film has been prepared for photolithographic patterning, which is then performed at step (40). Specifically, when the film is a photoresist film, it is then exposed in accordance with a mask and then developed to form photoresist patterns, which can then be used to transfer the patterns to the substrate or other films underlying the photoresist patterns.

In a particular embodiment, the component added as a stabilizer to the composition includes an atom or a group of atoms which are subject to leaving the film under appropriate conditions, such group commonly referred to as a "leaving group." More specifically a leaving group is an atom or group of atoms that leaves in a substitution or elimination reaction. This will be explained with reference to FIG. 3. As depicted therein, a composition includes a polymer chain 100 as deposited onto a substrate (not shown) to form a film. The polymer chain 100 is a co-polymer of the monomeric units 102, 104 in the relative quantities "n" and "m", respectively. First and second leaving groups 112 and 114 are attached to the monomeric units 102, 104 of the co-polymer composition, respectively, or become attached as a result of reaction and/or heating after deposition. The composition includes a solvent (not shown) which retains the composition in liquid and/or suspension form prior to being applied to the surface and which helps to promote spreading or self-planarization of the composition to form a film.

Figure 3:
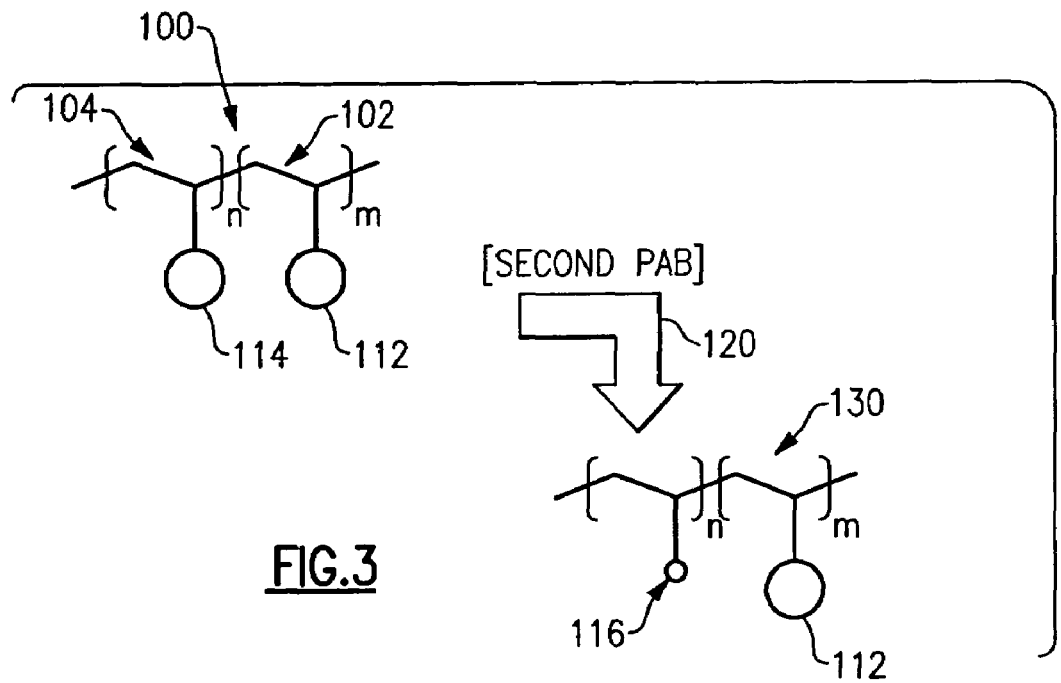
FIG. 3 is a schematic diagram illustrating an operating principle of a method of forming a film according to an embodiment of the invention.

As shown in FIG. 3, the leaving groups include a first leaving group 112 which is initially attached to a monomeric unit 102. The first leaving group 112 is provided in organic compositions such as ARCs and some types of photoresists. Specifically, the first leaving group 112 functions as an "acid catalyzed deprotection group", which is common in chemically amplified photoresists to provide the solubility switch that allows the resist image to be formed. Portions of the photoresist film which are exposed by photolithographic illumination become soluble by a developer solution due to the effect of the exposure upon the first leaving group 112. The function of the second leaving group is to adjust the long range interaction through the thin film between the substrate and the free interface of the film with the air, to prevent the film from dewetting the substrate. Desirably, the second leaving group changes the dielectric properties of the polymer such that the free energy of the system comprised by the composition applied to the target surface becomes less negative or becomes positive at the applied thickness of the film. The types of molecules to be used for the leaving group depend on the dielectric properties that need to be imparted to the composition. Specifically, the selection of particular molecules for the leaving group depends upon the base component polymer of the composition, how thin the resulting film needs to be, and the material of the substrate, which together place constraints on the dielectric properties of the leaving group. A fuller discussion of the principles behind the selection of the stabilizing component is provided below with reference to FIGS. 5-10. By way of example, some suitable leaving groups are heavily fluorinated compounds.

In a particular embodiment, the composition is applied to form a film having greater thickness than that of a film of a comparable composition that does not include the second leaving group. As depicted in FIG. 3, in a stage after the composition is applied to form a film on the substrate, the second leaving group 114, like the first leaving group 112, is connected to the backbone of the polymer chain 100. The presence of the second leaving group 114 causes the size of the polymer molecule 100 to be larger than what it would be without the second leaving group 112.

After applying the composition to the substrate, two steps of thermal processing are performed. In a first thermal processing step, the substrate and film thereon are baked in what is referred to as a "post-apply-bake process" ("PAB"), for the purpose of reducing the amount of a solvent which is present in the composition. During this first PAB, the additional second leaving group functions to prevent dewetting effects.

After the first PAB, with the solvent at least mostly removed from the film, the polymer chains become less mobile, making the film less subject to dewetting defects. Cross-linking may also occur at this time among the components of the film as a result of the PAB. Once the thin film has been stabilized in this way, i.e., through cross-linking, or the polymer chains becoming no longer sufficiently mobile to allow dewetting, the second leaving group is no longer needed for the stability of the film and can be removed.

In one preferred embodiment, second thermal processing, performed after the film has been stabilized, causes the second leaving group to leave the polymer chain 100. Desirably, the second leaving group is one which leaves the polymer chain 100 under temperatures that are relatively low, i.e., below the glass transition temperature of the composition which includes the polymer chains. However, the second leaving group 114 remains stably attached to the chain 104 at a temperature at which the solvent is caused to escape, e.g., evaporate, from the composition applied to the target surface. For example, a second thermal process such as a "post-applybake" ("PAB") process 120 can be performed under higher temperature conditions than the first PAB, with the purpose of eliminating the leaving group from the polymer chain 100. This results in the modified polymer chain 130 in which the second leaving group 114 is no longer present, leaving only a remnant 116, e.g., a portion of the original second leaving group, or a substituted group, in place of the second leaving group. However, at this time, the first leaving group 112 remains attached to the polymer chain 130, the first leaving group 112 functioning as the above-described solubility switch of the film.

The second leaving group can thus be removed, as by a second PAB, at any time after the plasticizing solvent is substantially removed from the film, i.e., after the first PAB. The characteristics of the second PAB and the film are desirably such that the film becomes densified during the second PAB, i.e., the film shrinks in thickness as a result of the second PAB. After the second PAB, the resulting thinner film shows good resistance to dewetting defects. In addition, the smaller thickness of the film produces superior results in subsequent photolithographic patterning and helps reduce the incidence of photoresist line pattern collapse. In some instances, no further processing is performed to the film, such that the next steps to be performed are photolithographic exposure and development. This applies also in cases in which the second leaving group is allowed to remain in the film, when its presence is deemed not to affect the film's photolithographic properties.

Among the benefits of this embodiment of the invention is the formation of a thinner film, e.g., an ARC or photoresist, whose characteristics are essentially unchanged from those of comparable thicker films. Because of this, subsequent processing, e.g., such as subsequent photolithographic patterning, is improved using the thinner film. The thickness of a stack of films including an ARC and a photoresist can also be reduced by the method in accordance with this embodiment of the invention, thus addressing the above-mentioned problem of photoresist pattern collapse.

Figure 4:
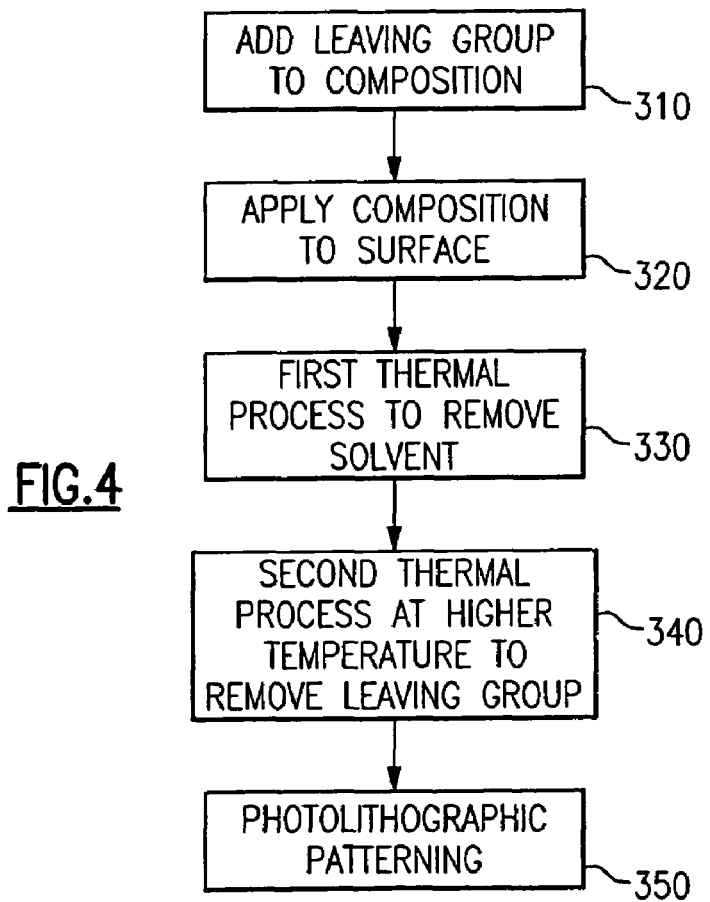
FIG. 4 is a flowchart illustrating a processing method in accordance with a specific embodiment of the invention.

Methods of forming a film according to this preferred embodiment are summarized in the flow diagram of FIG. 4. In this embodiment, in step 310, the leaving group is added to a composition. In step 320, the composition is applied to a surface of a substrate to be coated. Thereafter, in step 330, a first thermal process such as a first PAB is performed to remove the solvent from the composition. As mentioned above, the first PAB is performed under conditions which merely cause the solvent to be removed, as by evaporation, but not the second leaving group. Subsequently, in step 340, the second thermal process, e.g., second PAB, is then performed at a higher temperature than the first PAB for the purpose of removing the second leaving group. After such processing, the film is now ready for photolithographic patterning or other processing, as indicated in step 350.

Next, further explanation is provided to facilitate a deeper understanding of the factors which cause long-range van der Waals forces and the ways in which such forces are overcome by the embodiments of the invention. The long-range van der Waals forces and a Hamaker constant associated with the film or a stack of films determine the stability of a film stack. The free energy of a system consisting of any two materials separated by a medium of thickness h is given by the equation $$\phi_{vdW}(h) = -\frac{A}{12\pi h^2} \qquad \text{Equation (1)}$$

where $\phi_{vdW}$ is the free energy due to van der Waals forces, and A is referred to as the Hamaker constant.

Figure 5:
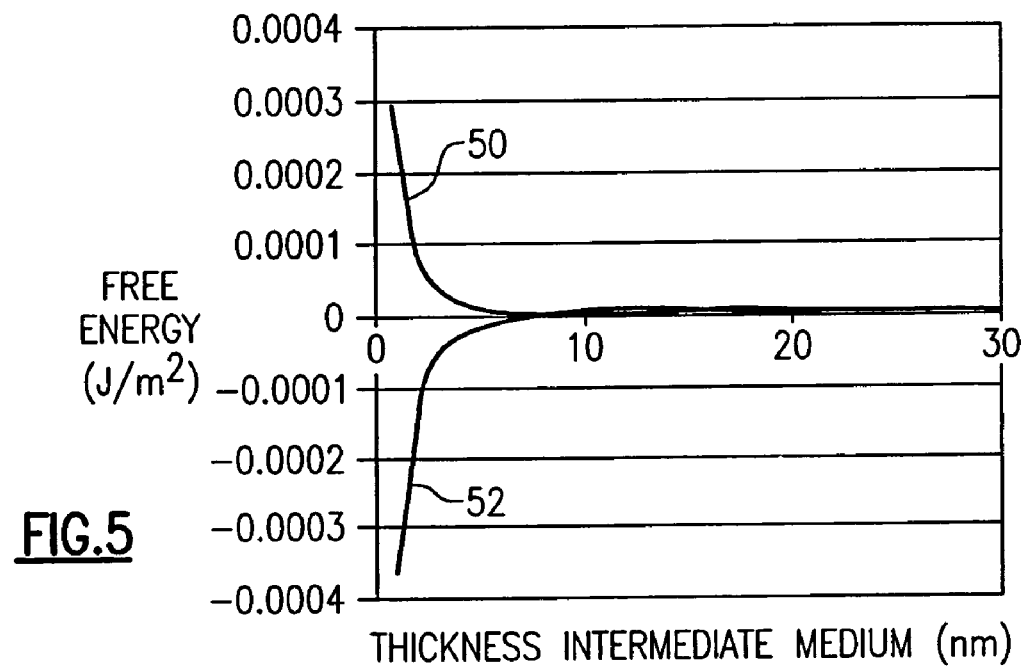
FIG. 5 is a graph depicting a free energy of a system for films of different thicknesses.

FIG. 5 graphs a curve 50 representing $\phi_{vdW}$ for different thicknesses in which the film has a negative value Hamaker constant A with respect to the substrate, and a curve 52 representing $\phi_{vdW}$ for different thicknesses in which the film has a positive value Hamaker constant A with respect to the substrate. As apparent from FIG. 5, equation (1) shows that for any material having a positive Hamaker constant, any decrease in the thickness of the film decreases the free energy of the film stack. The reduction in free energy results in the film becoming unstable and dewetting the substrate below a minimum thickness to minimize the overall free energy of the system. On the other hand, when the Hamaker constant is negative, it is apparent from curve 50 that decreasing the thickness of the film actually increases the free energy. Thus, the film stack remains stable.

The second derivative of the free energy according to Equation (1), is determined by $$\phi_{vdW}(h) = -\frac{A}{2\pi h^4}. \qquad \text{Equation (2)}$$

The zero in this curve determines the minimum thickness below which the deposited film is subject to spinodally dewetting from the substrate.

If a system consists of more than one intermediate medium, such as an arrangement in which a two-layered film stack is disposed between a substrate and an overlying medium, e.g., air, has free energy, which is determined by the equation:

$$\phi_{vdW}(h) = -\frac{A_2}{12\pi h^2} + \frac{A_2 - A_1}{12\pi(h+d)^2} \qquad \text{Equation (3)}$$

where $A_1$ is the Hamaker constant of the overlying film having an outer surface contacted by the medium, h is the thickness of the overlying film, $A_2$ is the Hamaker constant of the underlayer film which contacts the substrate, and d is its thickness.

Figure 6:
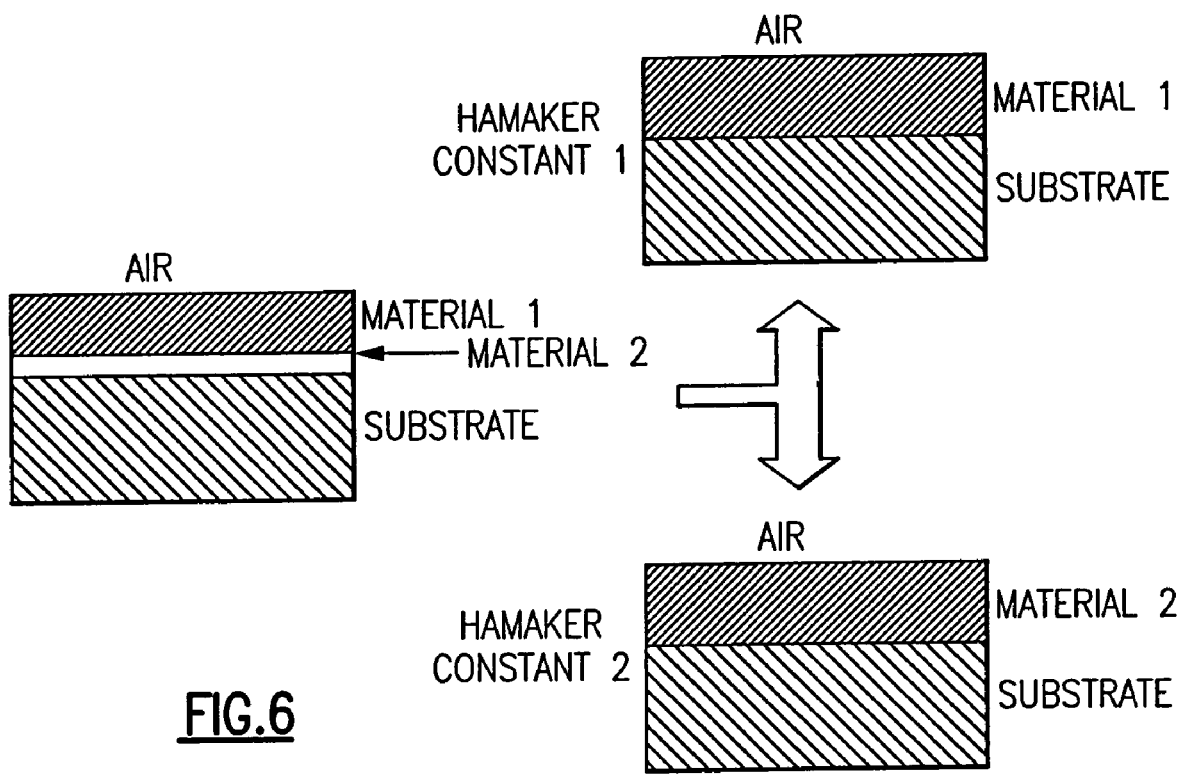
FIG. 6 is a diagram illustrating a principle of determining a Hamaker constant for a system including an overlayer film which overlies an intermediate film disposed on a substrate.

Referring to FIG. 6, the overall free energy of a system can be sub-divided into the components related to the free energy of two individual systems. In other words, the Hamaker constant $A_1$ is the same as the van der Waals component related to the having material 1 separating the air and the substrate, and $A_2$ is the component related to having material 2 separating the air and the substrate. In this way, the Hamaker constants of each material can be calculated individually, then combined to determine the overall free energy of the system.

The Hamaker constant of any two phases, such as labeled 1 (air) and 2 (substrate), interacting across a medium (material x), labeled as 3, can be calculated according to the equation:

$$A_1 = A_x = \frac{3kT}{4}\left(\frac{\varepsilon_1 - \varepsilon_x}{\varepsilon_1 + \varepsilon_x}\right)\left(\frac{\varepsilon_2 - \varepsilon_x}{\varepsilon_2 + \varepsilon_x}\right) + \qquad \text{Equation (4)}$$

$$\frac{3h\nu_e}{8\sqrt{2}} \frac{(n_1^2 - n_x^2)(n_2^2 - n_x^2)}{(n_1^2 + n_x^2)^{\frac{1}{2}}(n_2^2 + n_x^2)^{\frac{1}{2}}\left\{(n_1^2 + n_x^2)^{\frac{1}{2}} + (n_2^2 + n_x^2)^{\frac{1}{2}}\right\}}$$

where $\in_1$ is the permittivity of the medium, $\in_2$ is the pemittivity of the substrate, and $\in_x$ the permittivity of the first film, and $n_1$, $n_2$, and $n_x$ are the indices of refraction of the medium, the substrate, and the first film, respectively, k is the Boltzmann constant, T is temperature, h is Planck's constant and $\upsilon_e$ is the main electronic absorption frequency (usually $3.0 \times 10^{15} s^{-1}$). The Hamaker constant $A_2$ is a measure of the van der Waals component force determined for the underlayer film with respect to the substrate, according to the equation $$A_2 = A_y = \frac{3kT}{4}\left(\frac{\varepsilon_1 - \varepsilon_y}{\varepsilon_1 + \varepsilon_y}\right)\left(\frac{\varepsilon_2 - \varepsilon_y}{\varepsilon_2 + \varepsilon_y}\right) +$$

$$\frac{3h\upsilon_e}{8\sqrt{2}} \frac{(n_1^2 - n_y^2)(n_2^2 - n_y^2)}{(n_1^2 + n_y^2)^{\frac{1}{2}}(n_2^2 + n_y^2)^{\frac{1}{2}}\left\{(n_1^2 + n_y^2)^{\frac{1}{2}} + (n_2^2 + n_y^2)^{\frac{1}{2}}\right\}}$$

where $\upsilon_e$ is the main electronic absorption frequency, $\in_1$ is the permittivity of the medium, $\in_2$ the permittivity of thr substrate, and $\in_y$ the perinittivity of said second thin film, and $n_1$, $n_2$, and $n_y$ are the indices of refraction of the medium, the substrate, and said second film, respectively and T is the temperature. In the above equations, the permittivities of the substrate, film and medium (air) can be replaced by the dielectric constants $k_i = \in_i/\in_0$ (k is the Boltzmann constant) for each, since the permittivities are appear only in unitless factors.

It should be noted that the value of the dielectric constant and index of refraction are readily available for most materials, making the Hamaker constant easy to determine. Once the Hamaker constant of each film is determined, by using equation (3), the stability of a system can also be determined.

A co-polymer composition will now be described as a specific example of the embodiment described above with reference to FIG. 2. In this example, the substrate is silicon dioxide, material 1 is polystyrene and material 2 is polytetrafluoroethylene (PTFE). The properties of these materials are listed in Table 1 below:

| | |
|---|---|
| $n_{SiOx}$ | 1.460 |
| $n_{Polystyrene}$ | 1.557 |
| $n_{PTFE}$ | 1.359 |
| $\epsilon_{SiOx}/\epsilon_0$ | 3.90 |
| $\epsilon_{Polystyrene}/\epsilon_0$ | 2.55 |
| $\epsilon_{PTFE}/\epsilon_0$ | 2.10 |

From this table of properties, the Hamaker constant is readily calculated for each of the polystyrene and PTFE materials individually, with respect to an arrangement including the substrate, only one of the polystyrene and PTFE materials and the overlying medium (air) which contacts the outer surface of the film stack. The results of these calculations are:

$A_{polystyrene} = 1.358 \times 10^{-20}$ J, and $A_{PTFE} = -1.070 \times 10^{-20}$ J It is clear from the Hamaker constants that, individually, polystyrene is unstable as a film applied to an underlying substrate or underlayer of silicon dioxide. The Hamaker constant for PTFE indicates that that material is stable as a film on silicon dioxide.

As discussed above, in one embodiment of the invention, the addition of the second leaving group changes the dielectric properties of the "base polymer" (the original composition) of which a thin, defect-free film is desired to be formed. The addition of the second leaving group has an effect of stabilizing the base polymer in the new composition by shifting the Hamaker constant of the new composition to one having a negative, zero or at most minimally positive value from the original composition which has an intolerably high positive value for the thickness of the film to be achieved.

For a model polymer system which includes a copolymer of PTFE and polystyrene, it can be assumed, to a good approximation, that the Hamaker constant is dependent upon simple mixing rules for each component of the composition. Then, the Hamaker constant for the copolymer composition is a function of the percentage of the stabilizing component (PTFE), as graphically depicted in FIG. 7. For this example, the zero crossing 720 of the curve 710, indicating the crossover of the Hamaker constant from a stable system to an unstable system, occurs when the copolymer composition contains the PTFE component in a quantity of about 47 mole percent PTFE.

Figure 8:
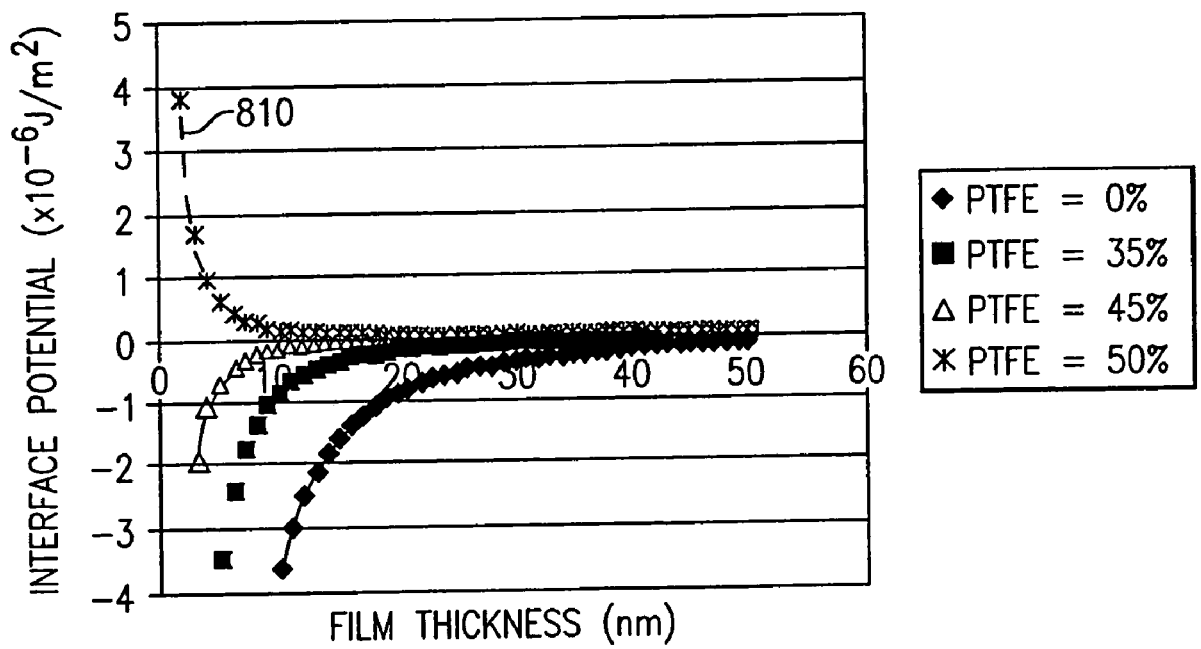
FIG. 8 is a graph showing results of a mathematical simulation as a set of curves representing an interface potential versus film thickness for different percentages of a stabilizing additive.

FIG. 8 graphs results of a mathematical simulation for determining the interface potential for a single film on a substrate as a function of the concentration of PTFE in the copolymer containing PTFE and polystyrene versus the thickness of the film. For a stable film, the interface potential must be a positive value. In this example, as indicated by curve 810, the film becomes stable for all thicknesses of the film when the percentage of PTFE exceeds 50%.

Note that the values of the crossover points for each composition provided according to this embodiment of the invention will vary based upon the properties of the base component and the stabilizing component of the co-polymer composition. However, as demonstrated graphically for the above example in FIGS. 7 and 8, the crossover point of the Hamaker constant, and the stability of the copolymer-containing composition for various film thicknesses can be calculated based on the known dielectric properties of the base component and the added stabilizing component. In each such case, the actual crossover point will be dependent on the materials included in the co-polymer.

Figure 7:
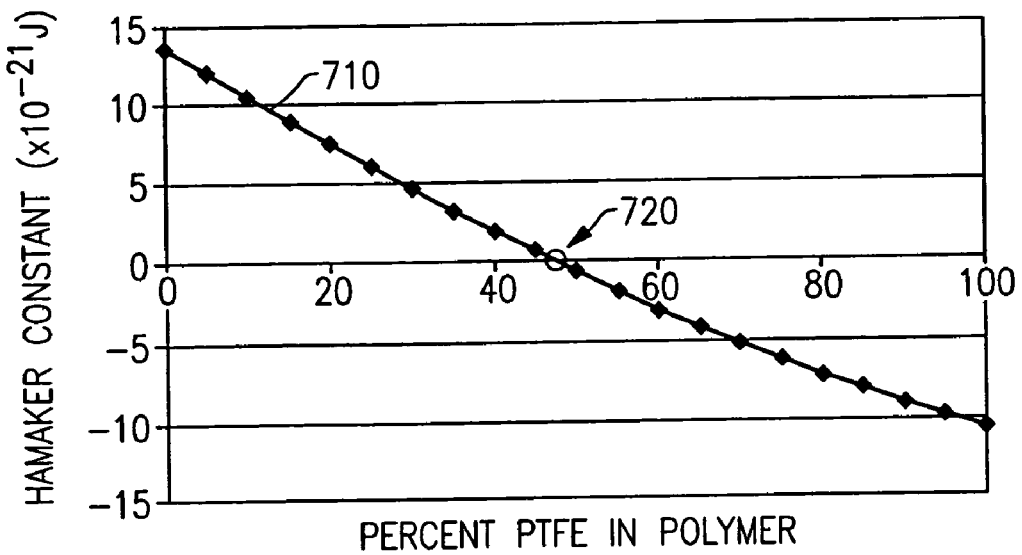
FIG. 7 is a graph depicting change in the Hamaker constant of a copolymer system versus different percentages of a stabilizing additive.

The results illustrated in FIGS. 7 and 8 are for a model co-polymer film that is disposed directly on the substrate. However, the co-polymer film may be provided instead as a film overlying an intermediate film, which, in turn, is disposed on a substrate. In such case, determining the interface potential function is more complicated.

The criteria for stability for a more complicated interface potential is when the second derivative of the equation for free energy is a positive value. The second derivative of the free energy is indicated by Equation (3) above. From equation (3), the amount of stabilization achieved for a given film stack according to the method described herein is related to the thickness and dielectric properties of the intermediate film.

Figure 9:
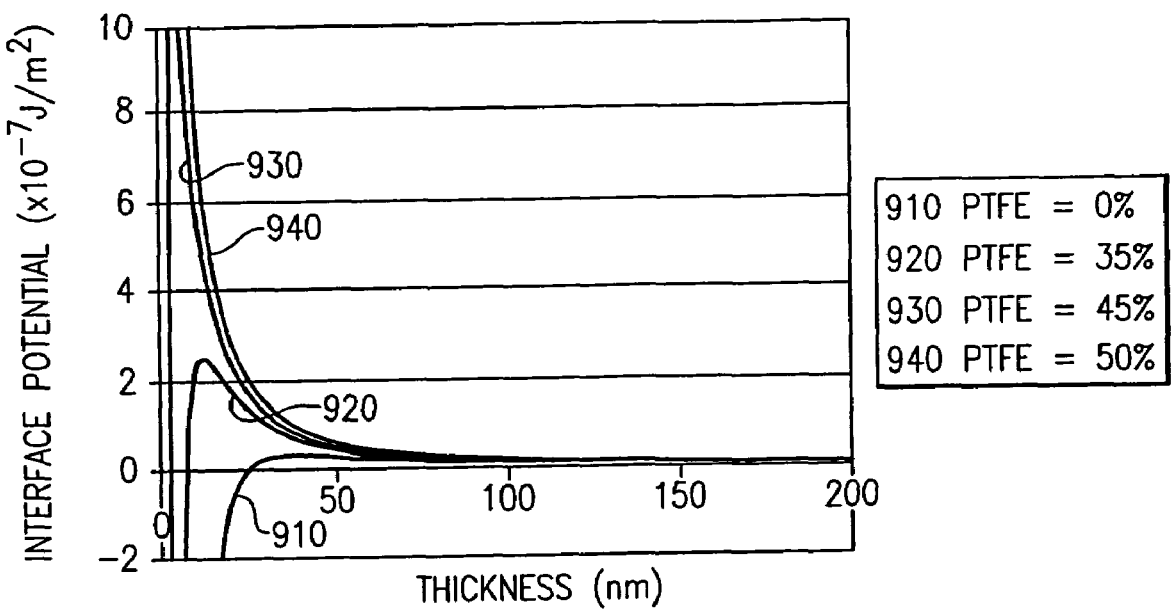
FIG. 9 is a graph depicting curves for an interface potential as a function of a concentration of PTFE in a model copolymer.
Figure 10:
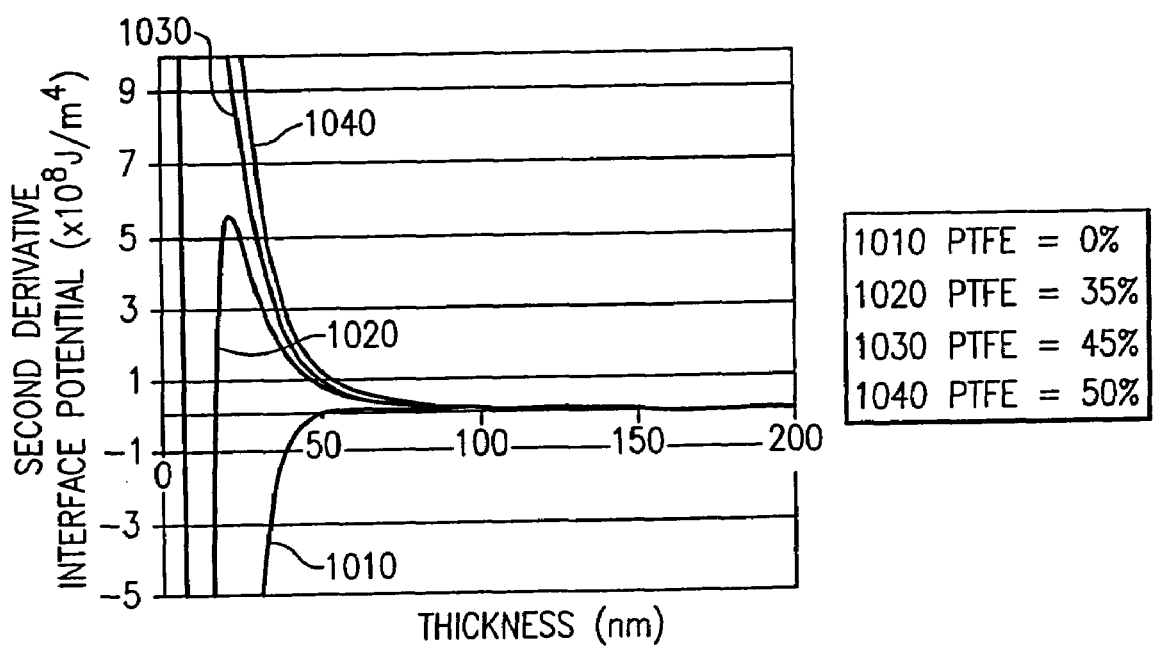
FIG. 10 is a graph depicting curves for a second derivative of an interface potential as a function of a concentration of PTFE in a model copolymer.

FIGS. 9 and 10 illustrate examples of a film stack in which the intermediate film has a thickness of 5 nm. FIG. 9 graphs values of the interface potential of a copolymer system of polystyrene with a PTFE additive, as a function of the film thickness, for various concentrations of PTFE. FIG. 10 graphs values of the second derivative of the interface potential for the same copolymer system, again as a function of the film thickness, for various concentrations of PTFE. As seen in FIG. 10, the copolymer film is stable in a film stack for all thicknesses in which the second derivative of the interface potential is positive.

Figure 1:
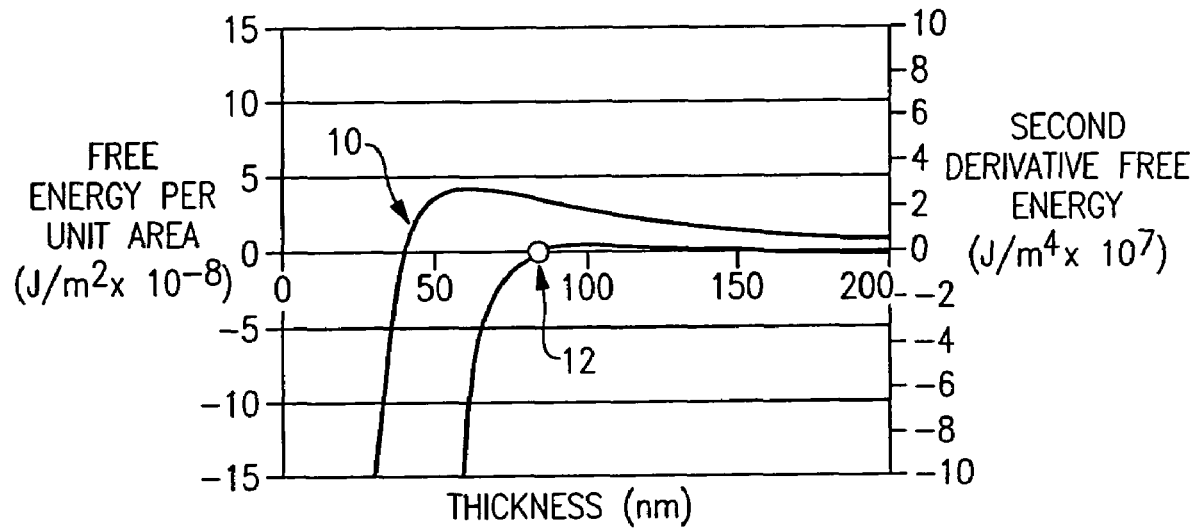
FIG. 1 is a graph illustrating free energy and a second derivative thereof for a bottom anti-reflective coating (BARC) as a function of thickness of the film on a substrate.

In summary, the advantages of adding a stabilizing component to a base component to form a co-polymer composition for depositing a film according to the invention are multifold. First, by an appropriate choice of the stabilizing component, the long range attractive force between the substrate and the free interface above the film is decreased or eliminated, which eliminates or substantially reduces the likelihood of pinhole defects in the film. When the stabilizing component includes a leaving group, the film may be applied as a thicker film to remain during and after the performance of the first PAB. As seen in FIG. 1, a thicker film, by itself, tends to reduce the free energy of the system and thus reduce the occurrence of dewetting defects, such as pinholes. Third, by heating the substrate with the film a second time to remove the leaving group, the film may become compacted, which improves the ease of imaging and tends to reduce the incidence of line pattern collapse.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of forming a stable thin film on a substrate, comprising:
depositing a liquid co-polymer composition onto a substrate to form a stable thin film having a first thickness, said thin film being one of a photoresist, an antireflective coating (ARC) or a bottom antireflective coating (BARC), said liquid co-polymer composition including a first component including a polymer chain being a co-polymer, a second component including a leaving group connected to said polymer chain, the leaving group including a heavily fluorinated compound, and a solvent, said first component having first dielectric properties not enabling said first component by itself to produce said stable thin film having said first thickness, said leaving group of said second component having second dielectric properties imparting stability to said thin film at said first thickness;
first thermal processing said thin film to cause said solvent but not said leaving group to be removed from said thin film, wherein said thin film remains stable during said first thermal processing; and
thereafter, second thermal processing said thin film to at least substantially remove said leaving group from said thin film, such that said thin film is reduced to a second thickness smaller than said first thickness, said thin film remaining stable during said second thermal processing, wherein said thin film remains substantially free of dewetting defects during said first and said second thermal processing.

2. The method as claimed in claim 1, wherein said first dielectric properties are characterized by a positive Hamaker constant relative to the substrate, and said second dielectric properties are characterized by a negative Hamaker constant relative to the substrate.

3. The method as claimed in claim 1, wherein prior to said second thermal processing said thin film has lower free energy than said thin film would have without said leaving group being connected to said polymer chain.

4. The method as claimed in claim 2, wherein said co-polymer composition has a lower Hamaker constant relative to the substrate than said Hamaker constant of said first component.

5. The method as claimed in claim 4, wherein said Hamaker constant of said co-polymer composition is negative.

6. The method as claimed in claim 1, wherein said second thermal processing is conducted at a temperature higher than said first thermal processing and lower than a glass transition temperature of said composition.

7. The method as claimed in claim 1, wherein said thin film is an overlying film, and said method further comprises depositing an intermediate film on the substrate prior to depositing said overlying film, said intermediate film having a dielectric property such that a film stack including said intermediate film and said overlying film disposed on the substrate is characterized by a second derivative of a free energy for said film stack having a positive value.

8. The method as claimed in claim 7, wherein the free energy is determined in accordance with an equation:

$$\phi_{vdW}(h) = -\frac{A_2}{12\pi h^2} + \frac{A_2 - A_1}{12\pi (h+d)^2}$$

where $A_1$ is said Hamaker constant of said overlying film having an outer surface contacted by a medium, h is the thickness of said overlying film, $A_2$ is said Hamaker constant of said intermediate film which contacts the substrate, and d is its thickness.

9. The method as claimed in claim 8, wherein said Hamaker constant of said overlying film is determined by calculating a first Hamaker constant $A_3$, determined according to the equation $$A_1 = A_x = \frac{3kT}{4}\left(\frac{\varepsilon_1 - \varepsilon_x}{\varepsilon_1 + \varepsilon_x}\right)\left(\frac{\varepsilon_2 - \varepsilon_x}{\varepsilon_2 + \varepsilon_x}\right) + \frac{3h\nu_e}{8\sqrt{2}} \frac{(n_1^2 - n_x^2)(n_2^2 - n_x^2)}{(n_1^2 + n_x^2)^{\frac{1}{2}}(n_2^2 + n_x^2)^{\frac{1}{2}}\left\{(n_1^2 + n_x^2)^{\frac{1}{2}} + (n_2^2 + n_x^2)^{\frac{1}{2}}\right\}}$$

where $\varepsilon_1$ is the permittivity of the medium, $\varepsilon_2$ the permittivity of the substrate, and $\varepsilon_x$ the permittivity of said first film, $n_3$, $n_2$, and $n_x$ are the indices of refraction of the medium, the substrate, and said overlying film, respectively, and said value of said second Hamaker constant $A_2$ for said intermediate film is determined according to the equation $$A_2 = A_y = \frac{3kT}{4}\left(\frac{\varepsilon_1 - \varepsilon_y}{\varepsilon_1 + \varepsilon_y}\right)\left(\frac{\varepsilon_2 - \varepsilon_y}{\varepsilon_2 + \varepsilon_y}\right) + \frac{3h\nu_e}{8\sqrt{2}} \frac{(n_1^2 - n_y^2)(n_2^2 - n_y^2)}{(n_1^2 + n_y^2)^{\frac{1}{2}}(n_2^2 + n_y^2)^{\frac{1}{2}}\left\{(n_1^2 + n_y^2)^{\frac{1}{2}} + (n_2^2 + n_y^2)^{\frac{1}{2}}\right\}}$$

where $\varepsilon_1$ is the permittivity of the medium, $\varepsilon_2$ the permittivity of the substrate, and $\varepsilon_y$ the permittivity of said intermediate film, and $n_3$, $n_2$, and $n_y$ are the indices of refraction of the medium, the substrate, and said intermediate film, respectively.

10. The method as claimed in claim 1, wherein the substrate has a surface including silicon dioxide over which said co-polymer composition is deposited to form said thin film.

11. The method as claimed in claim 1, wherein said thin film includes an antireflective coating (ARC).

12. The method as claimed in claim 1, wherein said thin film includes a bottom antireflective coating (BARC) and said method further comprises depositing a photoresist film to overlie said BARC and thereafter photolithographically patterning said photoresist film.

13. The method as claimed in claim 1, wherein said thin film includes a photoresist film.

* * * * *

UNITED STATES PATENT AND TRADEMARK OFFICE
CERTIFICATE OF CORRECTION

PATENT NO.       : 7,632,631 B2                                                    Page 1 of 1
APPLICATION NO. : 11/029813
DATED            : December 15, 2009
INVENTOR(S)      : Scheer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 952 days.

Signed and Sealed this

Second Day of November, 2010

David J. Kappos
*Director of the United States Patent and Trademark Office*